United States Patent [19]

Suppelsa et al.

[11] Patent Number: 5,373,276
[45] Date of Patent: Dec. 13, 1994

[54] SELF CENTERING COIL

[75] Inventors: Anthony J. Suppelsa, Coral Springs; Fadia Nounou, Plantation; Anthony B. Suppelsa, Coral Springs, all of Fla.

[73] Assignee: Motorola, Inc., Schaumburg, Ill.

[21] Appl. No.: 38,303

[22] Filed: Mar. 29, 1993

[51] Int. Cl.⁵ .................. H01F 15/02; H01F 15/10
[52] U.S. Cl. .................. 336/65; 174/94 R; 174/260; 361/760; 361/767; 361/773; 336/192
[58] Field of Search .................. 336/192, 65; 174/260, 174/94 R; 338/296, 298, 330; 219/541; 361/773, 767, 760

[56] References Cited

U.S. PATENT DOCUMENTS

| | | | |
|---|---|---|---|
| 848,676 | 4/1907 | Murgas | 336/192 |
| 1,581,133 | 4/1926 | Mackenzie | 336/192 |
| 1,897,089 | 2/1933 | Von Brockdorff | 338/296 |
| 2,572,069 | 10/1951 | Sparklin | 338/296 |
| 2,666,187 | 1/1954 | Ketcham | 336/192 |
| 3,555,477 | 1/1971 | Hildebrandt | 336/192 |
| 5,016,140 | 5/1991 | Prestel et al. | 361/773 |

Primary Examiner—Thomas J. Kozma
Attorney, Agent, or Firm—Pedro P. Hernandez

[57] ABSTRACT

A self centering coil (200) includes a coil section (202) and also having curved end section (206) and (204) at opposite sides of the coil section (202). The curved end sections are preferably substantially flat and in a plane which is parallel to the center axis (306) of the coiled section (202).

6 Claims, 2 Drawing Sheets

200

SELF CENTERING COIL

TECHNICAL FIELD

This invention relates in general to coils such as inductors, and more specifically to a self-centering coil.

BACKGROUND

The increase use of automatic pick and place machines for automatically placing electronic components onto printed circuit boards has drastically increased the speed in which printed circuit boards are assembled. However, when it comes to some components, such as multi-turn air wound coils, it becomes difficult for the pick and place machines to center the coils onto the solder cladded pads (contact pads having solder placed on the pads) found on the printed circuit board. With conventional straight leaded coils, the coils tend to shift before the domed cladded pads are reflowed. Another problem encountered with the straight leaded coils and particularly when placed on top of precladed printed circuit boards, is that the coils tend to tip over during the reflow process.

Referring to FIG. 1, there is shown a conventional air wound coil (inductor) 100 as known in the art. Air wound coil 100 includes two end leads 104 and 106. Coil 100 also includes a main body 102 having a plurality of loops (turns). Leads 104 and 106 are shown placed on top of corresponding connection pads 108 and 110, such as those typically found on printed circuit boards. Leads 104 and 106 are hard to center onto pads 108 and 110 found on printed circuit board 112, especially when the pads are precladed with solder (not shown), as used in conventional reflow processes. Also, as previously discussed, leads 104 and 106 given their straight shape, provide no support for coil 102, prior to the coil being soldered. This causes coil 100 to sometimes tip over during the soldering process. A need thus exists for a coil which can overcome the above mentioned problems.

DETAILED DESCRIPTION OF THE PREFERRED EMBODIMENT

Figure 1:
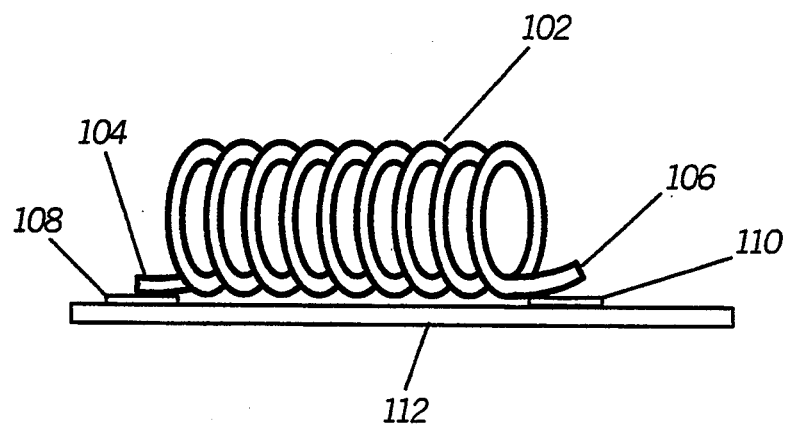
FIG. 1 is a drawing of a prior art air wound coil.

While the specification concludes with claims defining the features of the invention that are regarded as novel, it is believed that the invention will be better understood from a consideration of the following description in conjunction with the drawing figures, in which like reference numerals are carried forward.

Figure 2:
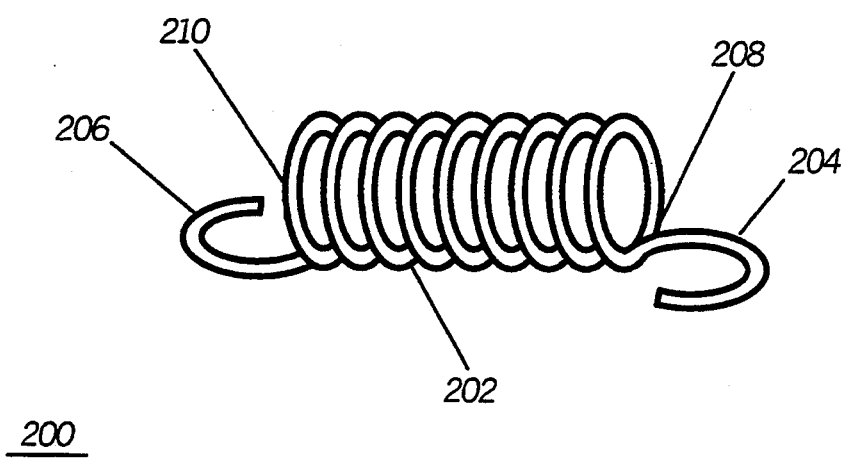
FIG. 2 is a drawing of a coil in accordance with the present invention.

Referring now to FIG. 2, there is shown a coil 200 in accordance with the present invention. Coil 200 is formed from a metallic material such as copper or another similar metal commonly used to form coils. The metal used to form the coil being preferably in the form of wire having substantially circular cross-section. Coil 200, includes a coil section 202 having at least one loop formed from copper wire. Coil 200 includes two geometric shaped (curved) end sections or end leads 204 and 206. Curved end section 204 is found on a first side 208 of coil section 202, while curved end section 206 is found on opposed side 210. Looped end sections 204 and 206 are bent such that they are substantially planner (the bottom surface of the loop end sections are substantially in one plane) and bent substantially perpendicular to opposed sides 210 and 208 respectively, so that the loop end sections can rest flush against a printed circuit board (not shown). End sections or leads 204 and 206 are preferably open-looped in shape, but they can also be circular, square, triangular, shaped as a "7", rectangular, etc. in shape. The geometric shape of leads 204 and 206 will help center coil onto a printed circuit board and will also prevent coil 200 from tipping over, since they give added support to coil section 202.

Figure 3:
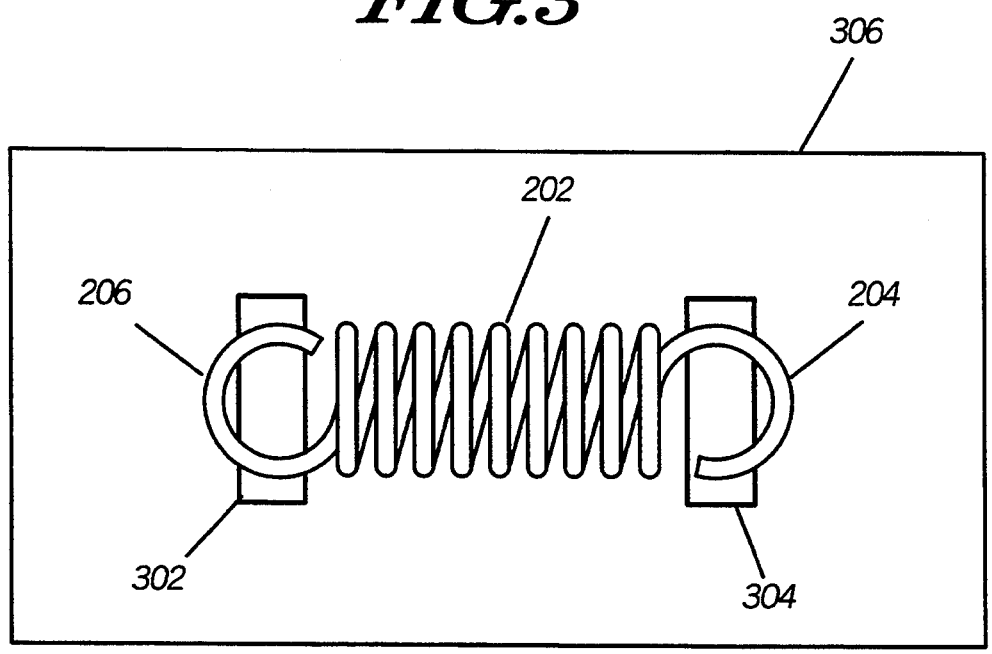
FIG. 3 shows a top view of a coil in accordance with the present invention.

In FIG. 3, a top view of coil assembly 300 is shown. In FIG. 3, the coil is mounted on to a printed circuit board 306 having contact pads 302 and 304. As shown in FIG. 3, curved end leads 204 and 206 provides for more lead surface area to come into contact with pads 302 and 304 than the conventional straight leads. this provides for improved solder joints to be developed over the conventional straight leads.

Figure 4:
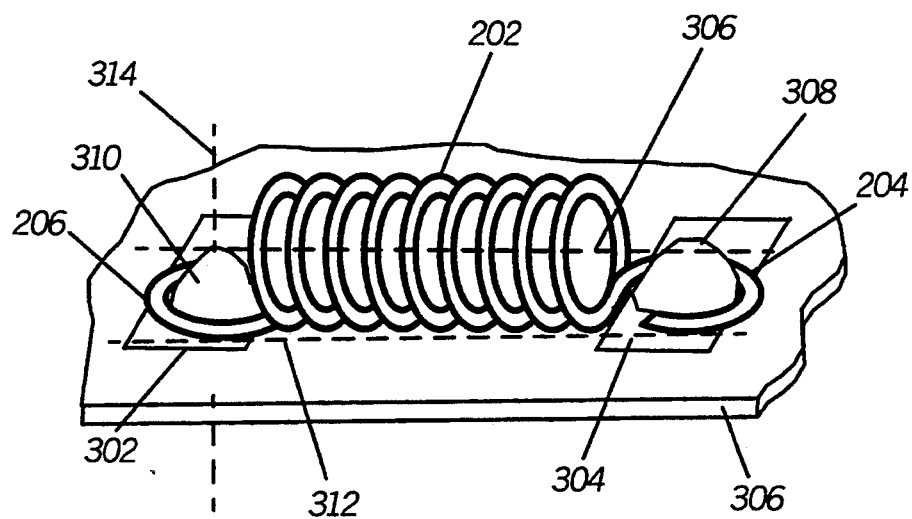
FIG. 4 shows a side view of a coil mounted onto a printed circuit board in accordance with the invention.

Referring now to FIG. 4, a side view of the coil assembly of FIG. 3 is shown. In FIG. 4, contact pads 302 and 304 are shown precladed with solder. Curved end sections 206 and 204 are shown wrapped around the perimeter of solder mounds 310 and 308 prior to the solder being reflowed. The curved end sections 206 and 204 are useful in centering the coil onto the solder pads since solder mounds (solder domes) 308 and 310 acts as guides for the end members. Solder domes 308 and 310 capture the looped end sections 206 and 204. Once the coil is placed onto the precladed printed circuit board 306, the board can then be soldered using a conventional solder reflow station.

As shown in FIG. 4, curved end sections 206 and 204 are curved in such a way that they are preferably substantially flat (the curved sections are substantially in one plane) and define a plane 312 which is substantially parallel to both the printed circuit board 306 and to center axis 306 of coil section 202. Plane 312 defined by curved end sections 204 and 206 is below center axis 306. In the preferred embodiment, curved end sections 204 and 206 are open-looped in shape as shown in FIG. 3, with the center axis 314 of the looped end members forming an axis which is substantially perpendicular to coil axis 306. Also, curved end sections 204 and 206 are outside of the cylinder defined by coil section 202.

In summary, the present invention provides for centering of coils and also improved stability for the coils once they are placed onto printed circuit boards, especially when using precladed printed circuit boards. The present invention provides for a cost effective solution to the problems encountered when using precladed boards and conventional straight leaded coils. The present invention also improves production quality since the present invention coils will fall or be miss centered much less during the pick and place process as compared to conventional straight leaded coils. Also, the invention provides for increased lead surface area which can help to form better solder connection with the solder pads.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An electronic assembly, comprising:
   a printed circuit board having first and second solder pads; and
   an air wound inductor coupled to the printed circuit board, comprising:
      a coil section having at least one loop substantially about a center axis and having opposed sides;
      first and second curved end sections one located at each of the opposed sides; and
      the first and second curved end sections define a plane which is substantially parallel to the center axis of the coil section, the first and second curved end sections each have a center axis which is substantially perpendicular to the center axis of the coil section, and the first and second curved end sections lie substantially flat one each on top of the first and second solder pads.

2. An electronic assembly as defined in claim 1, wherein the first and second curved end sections are substantially open-looped in shape.

3. An electronic assembly as defined in claim 1, wherein the first and second curved end sections are substantially circular in shape.

4. An electronic assembly as defined in claim 1, wherein the first curved end section is soldered to the first solder pad and the second curved end section is soldered to the second solder pad.

5. An electronic assembly as defined in claim 2, wherein the first and second curved end sections define a plane which is substantially parallel to the center axis of the coil section and the curved end sections are outside of the cylinder defined by the coil section.

6. An electronic assembly, as defined in claim 1, wherein the first and second solder pads have solder bumps and the first curved end member is substantially wrapped around the solder bump located on the first solder pad and the second curved end member is substantially wrapped around the solder bump located on the second solder pad.

* * * * *